United States Patent
Moon

(10) Patent No.: US 6,176,996 B1
(45) Date of Patent: Jan. 23, 2001

(54) TIN ALLOY PLATING COMPOSITIONS

(76) Inventor: Sungsoo Moon, #265-12, Hakjang-dong, Sasang-gu, Pusan (KR), 617-020

(*) Notice: Under 35 U.S.C. 154(b), the term of this patent shall be extended for 0 days.

(21) Appl. No.: 09/181,395

(22) Filed: Oct. 28, 1998

(30) Foreign Application Priority Data

Oct. 30, 1997 (KR) .................................. 97-56368

(51) Int. Cl.$^7$ ...................................... C25D 3/56
(52) U.S. Cl. .......................... 205/254; 205/253; 106/1.25
(58) Field of Search .................... 205/254–252; 106/1.25

(56) References Cited

U.S. PATENT DOCUMENTS 5,296,128 * 3/1994 Gernon et al. ................... 205/254
5,674,374 * 10/1997 Sakurai et al. ................... 205/253
5,769,381 * 6/1998 Sakurai et al. ................... 205/254

* cited by examiner

Primary Examiner—Kishor Mayekar
(74) Attorney, Agent, or Firm—Anderson Kill & Olick, PC

(57) ABSTRACT

A tin-based, two-component alloy electroplating composition comprising 20 to 500 g/l of a tin salt, 1 to 100 g/l of a metal salt selected from the group consisting of a zinc, cobalt, bismuth and copper salt, 20 to 200 g/l of methanesulfonic acid, 10 to 300 g/l of a conductive compound, and 0.5 to 50 g/l of a complexing agent provides a plating layer having excellent corrosion resistance and solderability to electronic devices such as lead frames, connectors and printed circuit boards.

7 Claims, No Drawings

TIN ALLOY PLATING COMPOSITIONS

FIELD OF THE INVENTION

The present invention relates to a tin-based alloy plating composition having improved corrosion resistance and solderability, which is suitable for plating lead frames, connectors, printed circuit boards and the like.

BACKGROUND OF THE INVENTION

The production of electronic devices such as lead frames, lead frame packages, connectors and printed circuit boards requires silver spot plating followed by solder-plating to improve the corrosion resistance and solderability thereof. Sn—Pb solder has been usually employed in such solder-plating process; however, the toxicity of the lead component poses a serious environmental hazard.

Accordingly, there have been many attempts to ameliorate the lead problem but a cost-effective solution has not yet been attained. For example, a method to plate palladium or gold on a Cu—Ni primer plating layer has been suggested, but this method has the problem of a high production cost.

The present inventors have endeavored to develop a new plating composition that can replace the environmentally hazardous Sn—Pb solder-plating composition, and have unexpectedly discovered that several novel tin-based alloy plating compositions are capable of providing solder plating layers having excellent corrosion resistance and solderability.

Hitherto, many kinds of tin-based alloy plating compositions have been reported. For example, U.S. Pat. No. 4,828,657 (Fukuoka et al., filed on May 9, 1989) describes tin-cobalt, tin-nickel and tin-lead binary alloy plating compositions, and U.S. Pat. No. 4,347,107 (Teichmann et al., filed on Aug. 31, 1982) mentions the deposition of tin as well as copper or rhodium alloys thereof on various substrates. However, these compositions are applied to ensure the deposition of bright metallic tin for a decorative purpose and are not suitable for solder plating electronic devices or for replacing the Sn—Pb solder-plating.

In addition, a tin-bismuth alloy plating composition containing a chelate salt such as an acid bismuth sulfate gluconate is described in U.S. Pat. No. 4,331,518 (Wilson, filed May 25, 1982); and a tin-nickel alloy plating composition comprising a fluoride is disclosed in U.S. Pat. No. 4,049,508 (Morrissey, filed Sep. 20, 1977). These compositions, however, give plating layers having poor solderability and emit harmful materials to the environment.

SUMMARY OF THE INVENTION

Accordingly, it is a primary object of the present invention to provide a tin-based, two-component alloy electroplating composition which does not contain harmful materials and can produce a plating layer having excellent corrosion resistance and solderability.

In accordance with one aspect of the present invention, there is provided a tin alloy electroplating composition comprising 20 to 500 g/l of a tin salt, 1 to 100 g/l of a metal salt selected from the group consisting of a zinc, cobalt, bismuth and copper salt, 20 to 200 g/l of methanesulfonic acid, 10 to 300 g/l of a conductive compound, and 0.5 to 50 g/l of a completing agent.

DETAILED DESCRIPTION OF THE INVENTION

The novel tin alloy plating composition of the present invention comprises: two metallic components, i.e., tin and a second metal selected from the group consisting of zinc, cobalt, bismuth and copper; methanesulfonic acid; a conductive compound and a complexing agent. As a source of tin, various tin compounds such as stannous methanesulfonate, stannous sulfate, stannous chloride and sodium stannate are employed in an amount ranging from 20 to 500 g/l in the composition.

The second metal component may be preferably employed in the form of a salt and it is employed in an amount ranging from 1 to 100 g/l in the composition.

Representative examples of zinc salts which may be used as the zinc source include zinc oxide, zinc sulfate, zinc chloride, zinc carbonate or zinc pyrophosphate. Representative examples of cobalt salts which may be used as the cobalt source include cobalt chloride, cobalt sulfate, cobalt acetate or cobalt carbonate. Representative examples of bismuth salts which may be used as the bismuth source include bismuth nitrate, bismuth acetate, bismuth sodium trioxide or bismuth chloride. Representative examples of copper salts which may be used as the copper source include copper nitrate, copper sulfate, copper carbonate, copper hydroxide, copper acetate or copper pyrophosphate.

In the composition of the present invention, methanesulfonic acid which enhances the conductivity of metal ions is employed in an amount ranging from 20 to 200 g/l.

The conductive compound used in the inventive plating composition not only further enhances the conductivity of metal ions but also increases the stability of the plating composition to provide uniform plating and an improved current efficiency. The conductive compound may include various acids and salts thereof. Preferable conductive compounds are citric acid, sulfuric acid, ammonium sulfate, ammonium citrate, sodium acetate, sodium carbonate, sodium gluconate or potassium pyrophosphate. One or more conductive compounds may be employed in an amount ranging from 10 to 300 g/l in the inventive composition.

The complexing agent used in the composition of the present invention forms a stable complex with the second metal to be alloyed with tin, thereby providing a stable plating composition, and it may be suitably selected depending on the second metal. Representative complexing agents include various acetates, amine salts, imine salts or amide salts. Preferably, the complexing agent may be selected from N,N,N',N'-tetrakis(2-hydroxypropyl)ethylenediamine, N,N,N',N'-tetrakis(2-pyridylmethylpropyl)ethylenediamine, triethanolamine, and a mixture thereof. The complexing agent is employed in an amount ranging from 0.5 to 50 g/l, preferably 10 to 30 g/l in the composition.

Further, the inventive composition may optionally include a surface modifier and/or a stress decreasing agent. Each of the surface modifier and stress decreasing agent may be used in an amount ranging from 0.01 to 0.1 g/l, preferably 0.01 to 0.05 g/l, respectively.

Representative examples of the surface modifier may be sodium alkylphenolethersulfate, ethoxylated nonylphenol, polyethoxylated aliphatic monoalkanolamide, 4-nitrophenyl-D-hepta(1→)-glucopyranocide or a mixture thereof, and representative examples of the stress decreasing agent may be vancomycin hydrochloride tetrahydrate, amino ionoferrel, ristomycin monosulfate, formylhexahydrocarbazole or a mixture thereof.

The novel inventive plating composition may be simply prepared by simply dissolving the specified components and optional other component(s) in water within the specified concentration ranges.

The composition may be applied to a substrate as follows:

A substrate to be plated and an anode are immersed in the inventive plating composition, and then an electric current ranging from 0.5 to 1.5 ASD (Ampere per Square Decimeter), more preferably 0.7 to 1.0 ASD, is applied across the substrate and the anode, while maintaining the temperature of the composition at a range of 30 to 40° C., more preferably at 35° C., while stirring the plating composition.

The novel tin-based plating composition in accordance with the present invention may be used in place of the conventional Sn—Pb solder-plating composition to eliminate the pollution problem associated with lead.

The present plating composition is stable and provides uniform plating having excellent corrosion resistance, solderability, conductibility, adhesive property and heat resistance.

Further, the present plating composition is suitable for plating devices such as lead frames, lead frame packages, connectors, printed circuit boards and other electronic parts, and may be applied with a conventional equipment, particularly a reel-to-reel type equipment.

The following Examples are intended to illustrate the present invention more specifically, without limiting the scope of the invention.

In the Examples, the adhesiveness and solderability were measured in accordance with the following Reference Examples.

REFERENCE EXAMPLE 1

Adhesiveness

A plated sample was baked at 400±5° C. for 2 minutes, and then, the appearance of the plated surface of the sample was examined with a magnifying glass (20×) or the naked eye to evaluate the following aspects:

i) Presence of blister, peeling, lifting and bleeding marks (No: good; Yes: poor).

ii) Presence of peeling and lifting marks when the sample was scratched with a nipper or a sharp material (No: good; Yes: poor).

iii) Presence of peeling marks when a piece of an adhesive tape (3M Scotch Tape: #540, #610 or #810) was firmly attached across the sample and then removed by a sharp peeling motion (No: good; Yes: poor).

REFERENCE EXAMPLE 2

Solderability

A plated sample was mold-hardened at 175° C. for 3 minutes and then kept at the same temperature for 3 hours. The hardened substrate was maintained at 145° C. for 95 hours and then soldered in a flux (Kester) for 3 seconds.

The uniformity of the soldered part was observed by a microscope (Nikon measurescope UM-2(25×)).

EXAMPLE 1

1 L of a tin-zinc alloy plating composition was prepared by dissolving the following ingredients in distilled water.

| Ingredients | Amounts |
| --- | --- |
| Stannous methanesulfonate | 190 g/l |
| Methanesulfonic acid | 75 g/l |
| Zinc sulfate | 14 g/l |
| Sodium gluconate | 35 g/l |
| Triethanolamine | 3.7 g/l |
| Ethoxylated nonylphenol | 0.03 g/l |
| Formylhexahydrocarbazole | 0.01 g/l |
| Ristomycin monosulfate | 0.02 g/l |

A lead frame was plated with 1 L of the resulting tin-zinc alloy plating composition at an electric current of 10 A/dm$^2$ to give an alloy plating layer of 90% tin and 10% zinc. The solderability and adhesiveness of the plated lead frame were determined in accordance with the methods as defined in Reference Examples 1 and 2. The results showed a uniform plating with 100% solderability and excellent adhesiveness.

EXAMPLE 3

1 L of a tin-bismuth alloy plating composition was prepared by dissolving the following ingredients in distilled water.

| Ingredients | Amounts |
| --- | --- |
| Potassium stannate | 200 g/l |
| Methanesulfonic acid | 50 g/l |
| Citric acid | 60 g/l |
| Bismuth (III) acetate | 18 g/l |
| Sodium acetate | 35 g/l |
| N,N,N',N'-tetrakis(2-pyridylmethyl-propyl)ethylenediamine | 15 g/l |
| Aminoionoferrel | 0.03 g/l |
| Polyethoxylated stearic monoethanolamide | 0.01 g/l |

A lead frame was plated with 1 L of the resulting tin-bismuth alloy plating composition at an electric current of 10 A/dm$^2$ to give an alloy plating layer of 90% tin and 10% bismuth. The solderability and adhesiveness of the plated lead frame were determined in accordance with the methods as defined in Reference Examples 1 and 2. The results showed a uniform plating with 100% solderability and excellent adhesiveness.

EXAMPLE 4

1 L of a tin-copper alloy plating composition was prepared by dissolving the following ingredients in distilled water.

| Ingredients | Amounts |
| --- | --- |
| Stannous methanesulfate | 240 g/l |
| Methanesulfonic acid | 65 g/l |
| Copper (II) sulfate | 25 g/l |
| Ammonium sulfate | 50 g/l |
| Citric acid | 30 g/l |
| Potassium sodium tartrate | 18 g/l |
| Ethylphenoxy sulfoxide poly (ethylene-oxyethanol) sodium salt | 0.02 g/l |

A lead frame was plated with 1 L of the resulting tin-copper alloy plating composition at an electric current of 10 A/dm$^2$ to give an alloy plating layer of 90% tin and 10% copper. The solderability and adhesiveness of the plated lead frame were determined in accordance with the methods as defined in Reference Examples 1 and 2. The results showed a uniform plating with 100% solderability and excellent adhesiveness.

While the invention has been described with respect to the specific embodiments, it should be recognized that various modifications and changes may be made by those skilled in the art to the invention which also fall within the scope of the invention as defined by the appended claims.

What is claimed is:

1. A tin alloy electroplating composition comprising 20 to 500 g/l of a tin salt, 1 to 100 g/l of a bismuth, 20 to 200 g/l of methanesulfonic acid, 10 to 300 g/l of a conductive compound, and 0.5 to 50 g/l of a complexing agent selected from the group consisting of N,N,N',N'-tetrakis(2-hydroxypropyl)ethylenediamine, N,N,N',N'-tetrakis(2-pyridylmethylpropyl)ethylene-diamine, triethanolamine and a mixture thereof.

2. The composition in accordance with claim 1, wherein the tin salt is selected from the group consisting of stannous methanesulfonate, stannous sulfate, stannous chloride, sodium stannate and a mixture thereof.

3. The composition in accordance with claim 1, wherein the bismuth salt is selected from the group consisting of bismuth nitrate, bismuth acetate, bismuth sodium trioxide, bismuth chloride and a mixture thereof.

4. The composition in accordance with claim 1, wherein the conductive compound is selected from the group consisting of ammonium sulfate, ammonium citrate, citric acid, sulfuric acid, sodium acetate, sodium carbonate, sodium gluconate, potassium pyrophosphate and a mixture thereof.

5. The composition in accordance with claim 1 further comprising a surface modifier selected from the group consisting of sodium alkylphenolethersulfate, ethoxylated nonylphenol, polyethoxylated aliphatic monoalkanolamide, 4-nitrophenyl-D-hepta(1→4)-glucopyranocide and a mixture thereof in an amount ranging from 0.01 to 0.1 g/l.

6. The composition in accordance with claim 1 further comprising a stress releasing agent selected from the group consisting of vancomycin hydrochloride tetrahydrate, amino ionoferrel, formylhexahydrocarbazole, ristomycinmonosulfate and a mixture thereof in an amount ranging from 0.01 to 0.1 g/l.

7. A method of plating a substrate with the composition according to any one of claims 1 to 3, 4, 5, and 6 at an electric current ranging from 0.5 to 1.5 ASD (Ampere per Square Decimeter) and a temperature ranging from 30 to 40° C.

* * * * *